United States Patent
Bang et al.

(10) Patent No.: US 10,758,875 B2
(45) Date of Patent: Sep. 1, 2020

(54) LIQUID SUPPLY UNIT, SUBSTRATE TREATING APPARATUS, AND METHOD FOR REMOVING BUBBLES

(71) Applicant: SEMES CO., LTD., Chungcheongnam-do (KR)

(72) Inventors: Byungsun Bang, Chungcheongnam-do (KR); Jin Tack Yu, Chungcheongnam-do (KR); Youngjun Choi, Chungcheongnam-do (KR); Jonghan Kim, Chungcheongnam-do (KR); Young Jin Jang, Daegu (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 218 days.

(21) Appl. No.: 15/856,197

(22) Filed: Dec. 28, 2017

(65) Prior Publication Data

US 2018/0185795 A1 Jul. 5, 2018

(30) Foreign Application Priority Data

Dec. 30, 2016 (KR) .................. 10-2016-0184378
Apr. 26, 2017 (KR) .................. 10-2017-0053272

(51) Int. Cl.
*B01F 3/22* (2006.01)
*B08B 3/08* (2006.01)
(Continued)

(52) U.S. Cl.
CPC .......... *B01F 3/2223* (2013.01); *B01F 3/0861* (2013.01); *B01F 5/0057* (2013.01);
(Continued)

(58) Field of Classification Search
CPC ....... B05B 1/34; B05B 7/0408; B05B 1/3405; B05B 1/341; B05B 1/3436; B05B 1/3447;
(Continued)

(56) References Cited

U.S. PATENT DOCUMENTS 5,603,453 A * 2/1997 Weaver ................. B05B 7/0075
239/8
5,868,321 A * 2/1999 Haruch ................. B05B 1/3436
239/399

(Continued)

FOREIGN PATENT DOCUMENTS

KR 1020080035718 A 4/2008
KR 10-2011-0000228 A 1/2011
(Continued)

*Primary Examiner* — Joseph L. Perrin
*Assistant Examiner* — Irina Graf
(74) *Attorney, Agent, or Firm* — Li & Cai Intellectual Property (USA) Office

(57) ABSTRACT

Disclosed are an apparatus and a method for liquid-treating a substrate. The substrate treating apparatus includes a liquid supply unit configured to supply a treatment liquid in which a first liquid and a second liquid are mixed, onto the substrate unit, wherein the liquid supply unit includes a nozzle configured to discharge the treatment liquid, a first liquid supply line supplying the first liquid to the nozzle, and a second liquid supply supplying the second liquid to the nozzle, and the nozzle includes a body having a mixing space in which the first liquid and the second liquid are mixed and a buffer space extending from the mixing space, in the interior thereof, and a collision member located in the buffer space and configured to decrease a flow velocity of the treatment liquid supplied to the buffer space.

14 Claims, 6 Drawing Sheets

(51) Int. Cl.
  *H01L 21/67*   (2006.01)
  *B01F 3/08*    (2006.01)
  *B08B 3/02*    (2006.01)
  *B08B 3/10*    (2006.01)
  *B05B 1/34*    (2006.01)
  *B01F 5/00*    (2006.01)
  *B05B 7/04*    (2006.01)

(52) U.S. Cl.
  CPC .............. *B05B 1/34* (2013.01); *B05B 7/0408* (2013.01); *B08B 3/02* (2013.01); *B08B 3/08* (2013.01); *B08B 3/102* (2013.01); *H01L 21/67051* (2013.01); *B01F 2215/0096* (2013.01); *B08B 2203/002* (2013.01)

(58) Field of Classification Search
  CPC ........... B05B 1/3478; B05B 7/04; B08B 3/02; B08B 3/08; B08B 3/102; H01L 21/67051; H01L 21/6708; B01F 2215/0096; B01F 3/0865; B01F 3/2223
  See application file for complete search history.

(56) References Cited

U.S. PATENT DOCUMENTS

| | | | |
|---|---|---|---|
| 2011/0220286 A1* | 9/2011 | Park | B01F 5/0057 |
| | | | 156/345.11 |
| 2014/0041694 A1* | 2/2014 | Miyazaki | B08B 3/02 |
| | | | 134/102.2 |
| 2014/0239081 A1* | 8/2014 | Schlecht | B05B 7/10 |
| | | | 239/9 |

FOREIGN PATENT DOCUMENTS

| | | |
|---|---|---|
| KR | 10-2011-0103093 A | 9/2011 |
| KR | 10-2013-0135792 A | 12/2013 |
| KR | 1020140108165 A | 9/2014 |

* cited by examiner

LIQUID SUPPLY UNIT, SUBSTRATE TREATING APPARATUS, AND METHOD FOR REMOVING BUBBLES

CROSS-REFERENCE TO RELATED APPLICATIONS

A claim for priority under 35 U.S.C. § 119 is made to Korean Patent Application No. 10-2016-0184378 filed on Dec. 30, 2016 and Korean Patent Application No. 10-2017-0053272 filed on Apr. 26, 2017, in the Korean Intellectual Property Office, the entire contents of which are hereby incorporated by reference.

BACKGROUND

Embodiments of the inventive concept described herein relate to an apparatus and a method for liquid-treating a substrate, and more particularly, to an apparatus and a method for removing bubbles from a liquid.

In order to manufacture a semiconductor device, a desired pattern is formed on a substrate through various processes such as, photographing, etching, ashing, ion injection, and deposition of thin films. The processes become various and complex over time, and contaminants and particles are generated. Accordingly, cleaning processes for cleaning a substrate are performed before and after the respective processes.

In the cleaning processes, generally, mixture liquids that are mixed with different chemicals are supplied to a substrate. The chemicals are mixed before being supplied to nozzles, or are mixed in the interiors of the nozzles. A large amount of bubbles are generated in the processes of mixing the chemicals.

Due to this, the mixture liquids containing bubbles are supplied to the substrate. The bubbles are burst while being supplied to the substrate or being diffused to the substrate. The sizes of the bubbles are various, and as the bubbles burst, the mixture liquids spatter to all directions. The spattering bubbles are attached to equipment located around the substrate, and contaminate the surrounding equipment.

In addition, unlike the liquids, the bubbles cannot be promptly removed, and when the bubbles are left on the substrate, a process error is caused.

SUMMARY

Embodiments of the inventive concept provide an apparatus and a method for removing bubbles generated in a process of mixing two or more chemicals.

Embodiments of the inventive concept also provide an apparatus and a method for preventing a mixture liquid that spatters as bubbles burst from contaminating apparatuses around a substrate.

The inventive concept provides an apparatus and a method for liquid-treating a substrate. The substrate treating apparatus includes a substrate support unit configured to support a substrate, and a liquid supply unit configured to supply a treatment liquid in which a first liquid and a second liquid are mixed, onto the substrate supported by the substrate support unit, wherein the liquid supply unit includes a nozzle configured to discharge the treatment liquid, a first liquid supply line configured to supply the first liquid to the nozzle, and a second liquid supply line configured to supply the second liquid to the nozzle, and the nozzle includes a body having a mixing space in which the first liquid and the second liquid are mixed and a buffer space extending from the mixing space, in the interior thereof, and a collision member located in the buffer space and configured to decrease a flow velocity of the treatment liquid supplied to the buffer space.

The nozzle may further include a separation plate configured to separate the mixing space and the buffer space from each other and having a first hole. When viewed from the top, the collision member may overlap the first hole. The collision member may include a collision body configured to divide the buffer space into an upper space and a lower space and having an open-topped vessel shape, and the treatment liquid accommodated in the collision body overflows and is supplied to the lower space. The body may further have a discharge space extending from the lower space and including a discharge end, the nozzle may further include a lower plate configured to separate the lower space and the discharge space from each other and having a lower hole, and when viewed from the top, the lower hole may be located to overlap the collision body. The discharge space may be provided such that a width of a lower area thereof is smaller than a width of an upper area thereof.

The first liquid and the second liquid may include a liquid that generates bubbles while the first liquid and the second liquid are mixed. The first liquid may include a sulfuric acid, and the second liquid may include hydrogen peroxide.

The first hole may include a plurality of first holes, the separation plate may further have a second hole, the second hole may be located in a central area of the separation plate, and the first holes may be located to surround the second hole. The diameters of the first holes may be larger than that of the second hole. The body may further have a first passage extending to the mixing space and to which a first liquid supply line is connected, and a second passage extending to the mixing space and to which a second liquid supply line is connected, the first passage may face a downward direction at a location that is adjacent to an inner surface of the mixing part, and the second passage may be provided in a spiral direction at a location that is adjacent to the inner surface of the mixing part.

In accordance with another aspect of the inventive concept, there is provided a liquid supply unit for supplying a treatment liquid in which a first liquid and a second liquid are mixed, the liquid supply unit including a nozzle configured to discharge the treatment liquid, a first liquid supply line configured to supply the first liquid to the nozzle, and a second liquid supply line configured to supply the second liquid to the nozzle, and wherein the nozzle includes a body having a mixing space in which the first liquid and the second liquid are mixed and a buffer space extending from the mixing space, in the interior thereof, and a collision member located in the buffer space and configured to decrease a flow velocity of the treatment liquid supplied to the buffer space.

The nozzle further may include a separation plate configured to separate the mixing space and the buffer space from each other and having a first hole, and when viewed from the top, the collision member may overlap the first hole. The collision member may include a collision body configured to divide the buffer space into an upper space and a lower space and having an open-topped vessel shape, the treatment liquid accommodated in the collision body may overflows and may be supplied to the lower space.

The first liquid may include a sulfuric acid, and the second liquid may include hydrogen peroxide.

In accordance with another aspect of the inventive concept, there is provided a method for removing bubbles from a treatment liquid in which a first liquid and a second liquid are mixed, the method including forming the treatment liquid by mixing the first liquid and the second liquid in a mixing space formed in a nozzle, and removing the bubbles by forcing the treatment liquid to collide with a collision member located in a buffer space extending from the mixing space. A flow velocity of the treatment liquid may be increased by a separation plate located between the mixing space and the buffer space and may be decreased while the treatment liquid collides with the collision member.

The collision member may allow a flow path of the treatment liquid to detour such that a time period for which the treatment liquid is left in the buffer space increases. The collision member may include a collision member having an open-topped vessel shape, and the treatment liquid accommodated in the collision body may overflow.

The first liquid may include a sulfuric acid, and the second liquid may include hydrogen peroxide.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
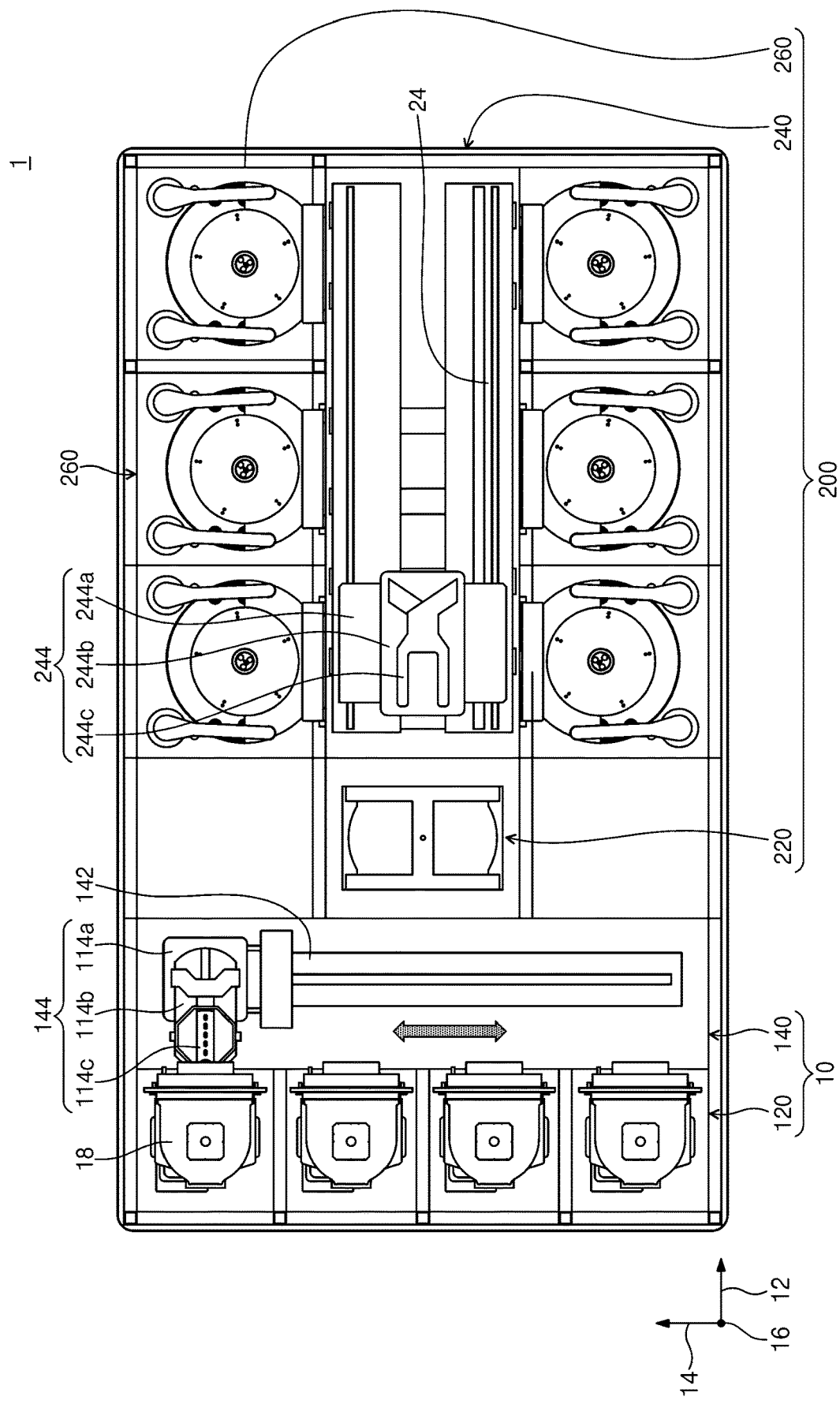
FIG. 1 is a plan view illustrating a substrate treating system according to a first embodiment of the inventive concept.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

An embodiment of the inventive concept will be described with reference to FIGS. 1 to 6.

FIG. 1 is a plan view illustrating a substrate treating system according to a first embodiment of the inventive concept.

Referring to FIG. 1, the substrate treating system 1 has an index module 10 and a process treating module 20, and the index module 100 includes a plurality of load ports 120 and a feeding frame 140. The load ports 120, the feeding frame 140, and the process treating module 20 may be sequentially arranged in a row. Hereinafter, a direction in which the load ports 120, the feeding frame 140, and the process treating module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18, in which a substrate W is received, is seated on the load port 120. A plurality of load ports 120 are provided, and are arranged along the second direction 14 in a row. FIG. 1 illustrates that four load ports 120 are provided. However, the number of the load ports 120 may increase or decrease according to a condition, such as the process efficiency of the process treating module 20 or a footprint. A plurality of slots (not illustrated) provided to support peripheries of substrates are formed in the carrier 18. A plurality of slots are provided along the third direction 16, and the substrate is situated in the carrier 18 such that the substrates are stacked to be spaced apart from each other along the third direction 16. A front opening unified pod (FOUP) may be used as the carrier 18.

The process treating module 20 includes a buffer unit 220, a feeding chamber 240, and a plurality of process chambers 260. The feeding chamber 240 is disposed such that the lengthwise direction thereof is in parallel to the first direction 12. The process chambers 260 are disposed on opposite sides of the feeding chamber 240 along the second direction 14. The process chambers 260 are symmetrical to each other with respect to the feeding chamber 240. Some of the process chambers 260 are arranged along the lengthwise direction of the feeding chamber 240. Furthermore, some of the process chambers 260 are arranged to be stacked on each other. That is, the process chambers 260 having an array of A by B (A and B are natural numbers) may be arranged on opposite sides of the feeding chamber 240. Here, A is the number of the process chambers 260 provided in a row along the first direction 12, and B is the number of the process chambers 260 provided in a row along the third direction 16. When four or six process chambers 260 are provided on opposite sides of the feeding chamber 240, the process chambers 260 may be arranged in an array of 2 by 2 or 3 by 2. The number of the process chambers 260 may increase or decrease.

Unlike the above-mentioned description, the process chambers 260 may be provided only on one side of the feeding chamber 240. Further, the process chambers 260 may be provided on one side or an opposite side of the feeding chamber 240 to form a single layer. Further, unlike the above-mentioned description, the process chambers 260 may be disposed variously.

The buffer unit 220 is disposed between the feeding frame 140 and the feeding chamber 240. The buffer unit 220 provides a space in which the substrates W stay before being transported, between the feeding chamber 240 and the feeding frame 140. Slots (not illustrated) in which the substrates W is positioned are provided in the buffer unit 220, and a plurality of slots (not illustrated) are provided to be spaced apart from each other along the third direction 16. A face of the buffer unit 220 that faces the feeding frame 140 and a face of the buffer unit 220 that faces the feeding chamber 240 are opened.

The feeding frame 140 transports the substrates W between the carrier 18 seated on the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a.

The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are disposed to be stacked so as to be spaced apart from each other along the third direction 16. Some of the index arms 144c are used when the substrates W are transported to the carrier 18 in the process module 20, and some of the index arms 144c may be used when the substrates W are transported from the carrier 18 to the process treating module 20. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260. A guide rail 242 and a main robot 244 are provided in the feeding chamber 240. The guide rail 242 is disposed such that the lengthwise direction thereof is parallel to the first direction 12. The main robot 244 is installed on the guide rail 242, and is linearly moved along the first direction 12 on the index rail 242.

The process chambers 260 may be provided to sequentially perform processes on one substrate W. For example, the substrate W may undergo a chemical process, a rinsing process, and a drying process in the process chambers 260.

Figure 2:
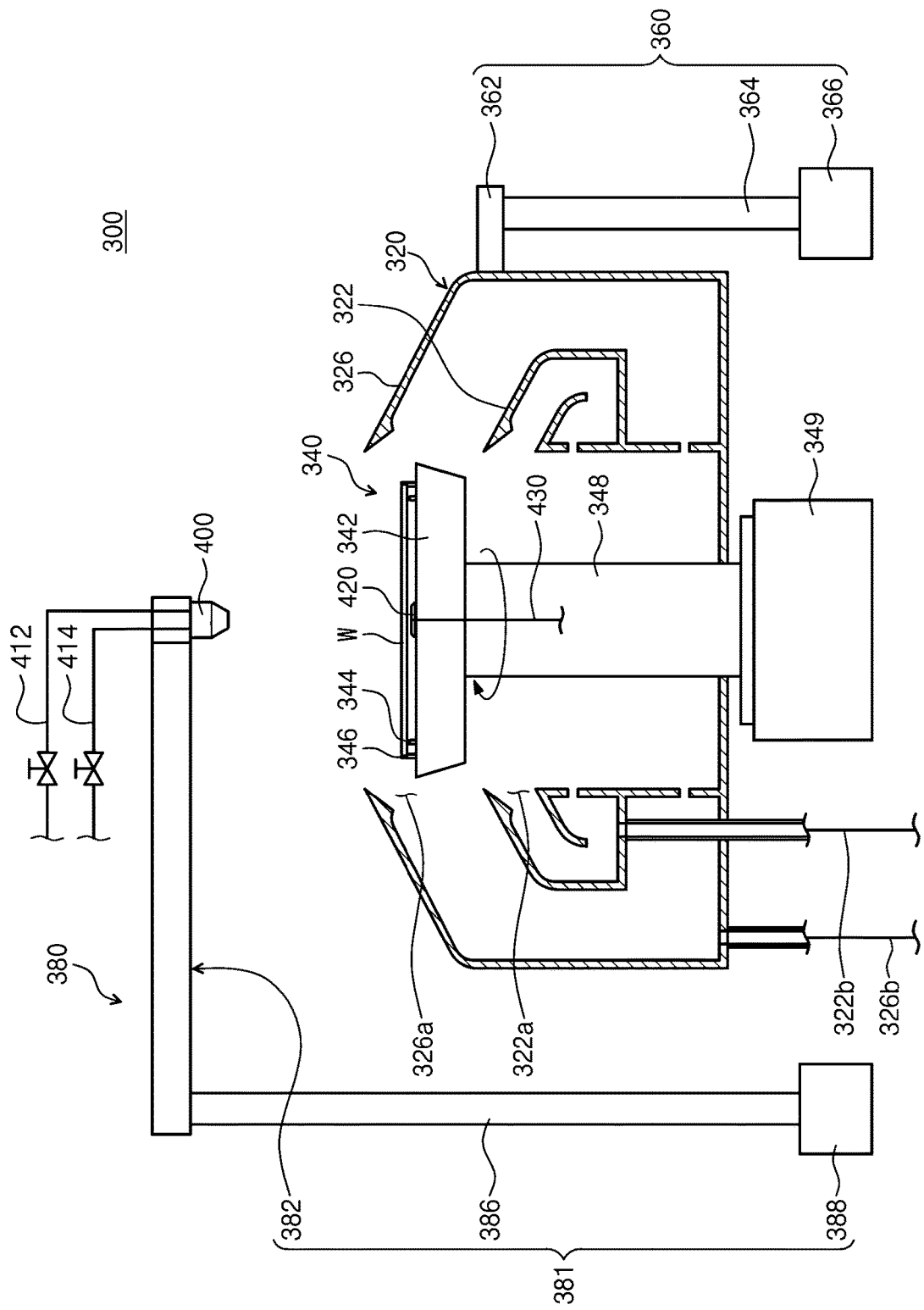
FIG. 2 is a sectional view illustrating the substrate treating apparatus of FIG. 1.

Hereinafter, a substrate treating apparatus 300 provided in the process chamber 260 will be described. FIG. 2 is a sectional view illustrating a substrate treating apparatus of FIG. 1. Referring to FIG. 2, the substrate treating apparatus 300 includes a treatment container 320, a spin head 340, an elevation unit 360, and a liquid supply unit 380. The treatment container 320 has a treatment space, in which a process of treating a substrate W is performed, in the interior thereof. The treatment container 320 has an open-topped cup shape. The treatment container 320 includes an inner recovery vessel 322 and an outer recovery vessel 326. The recovery vessels 322 and 326 recover different treatment liquids used in the process. The inner recovery vessel 322 is provided to have an annular ring shape that surrounds the spin head 340, and the outer recovery vessel 326 is provided to have an annular ring shape that surrounds the inner recovery vessel 322. An inner space 322a of the inner recovery vessel 322 and a space between the outer recovery vessel 326 and the inner recovery vessel 322 function as inlets, through which the treatment liquid is introduced into the inner recovery vessel 322 and the outer recovery vessel 326, respectively. Recovery lines 322b and 326b extending from the recovery vessels 322 and 326 perpendicularly in the downward direction of the bottom surfaces thereof are connected to the recovery vessels 322 and 326, respectively. The recovery lines 322b and 326b discharge the treatment liquids introduced through the recovery vessels 322 and 326, respectively. The discharged treatment liquids may be reused through an external treatment liquid recycling system (not illustrated).

The spin head 340 is provided as a substrate support unit 340 that supports and rotates the substrate W. The spin head 340 is arranged in a treatment space of the treatment container 320. The spin head 340 supports and rotates the substrate W during the process. The spin head 340 has a body 342, a plurality of support pins 344, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342. A plurality of support pins 344 are provided. The support pins 344 may be arranged to be spaced apart from each other at a periphery of the upper surface of the body 342 and protrude upwards from the body 342. The support pins 334 are arranged to have a generally annular ring shape through combination thereof. The support pins 344 support a periphery of a rear surface of the substrate W such that the substrate W is spaced apart from the upper surface of the body 342 by a predetermined distance. A plurality of chuck pins 346 are provided. The chuck pins 346 are arranged to be more distant from the center of the body 342 than the support pins 344. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 adjusts a relative height between the container 320 and the spin head 340. The elevation unit 360 linearly moves the container 320 upwards and downwards. When the container 320 is moved upwards and downwards, a relative height of the container 320 to the spin head 340 is changed. The elevation unit 360 has a bracket 362, a movable shaft 364, and a driver 366. The bracket 362 is fixedly installed on an outer wall of the container 320, and the movable shaft 364 that is moved upwards and downwards by the driver 366 is fixedly coupled to the bracket 362. The treatment container 320 is lowered such that, when the substrate W is positioned on the spin head 340 or is lifted from the spin head 340, the spin head 340 protrudes to the upper side of the treatment container 320. When the process is performed, the height of the container 320 is adjusted such that the treatment liquid is introduced into the preset recovery vessel 360 according to the kind of the treatment liquid supplied to the substrate W.

Unlike those described above, the elevation unit 360 may move the spin head 340, instead of the treatment container 320, upwards and downwards.

The liquid supply unit 380 supplies a treatment liquid onto the substrate W. A plurality of liquid supply units 380 are provided, and supply different kinds of liquids, respectively. Each of the liquid supply units 380 includes a driving member 381, a nozzle 400, a first liquid supply line, and a second liquid supply line. The driving member 381 moves the nozzle 400 to a process location and a standby location. Here, the process location is a location at which the nozzle 400 is disposed at a vertical upper portion of the treatment container 320, and the standby location is a location at which the nozzle 400 deviates from the vertical upper portion of the treatment container 320. According to an example, the process location may be a location at which the nozzle 400 may supply the liquid to the center of the substrate W. The driving member 381 has an arm 382, a support shaft 386, and a driver 388. The support shaft 386 is located on one side of the treatment container 320. The lengthwise direction of the support shaft 386 is provided along the third direction 16, and the driver 388 is coupled to a lower end of the support shaft 386. The driver 388 rotates and elevates the support shaft 386. The support arm 382 is fixedly coupled to an upper end of the support shaft 386. The arm 382 has a lengthwise direction that is perpendicular to the support shaft 386.

The first liquid supply line 412 and the second liquid supply line 414 are connected to the nozzle 400. The first liquid supply line 412 supplies a first liquid to the nozzle 400, and the second liquid supply line 414 supplies a second liquid to the nozzle 400. The first liquid and the second liquid may be mixed in the interior of the nozzle 400.

The nozzle 400 may discharge the treatment liquid. The nozzle 400 is installed on a bottom surface of an end of the arm 382. The nozzle 400 is moved together with the arm 382 through rotation of the support shaft 386. For example, the treatment liquid includes a mixture liquid in which the first liquid and the second liquid are mixed. The first liquid and the second liquid may include a liquid that generates bubbles while the first liquid and the second liquid are mixed. Any one of the first liquid and the second liquid includes a sulfuric acid, and the other one includes hydrogen peroxide. Selectively, the first liquid has a property of a strong acid, and the second liquid has a property of a strong alkali.

Unlike this, a liquid supply unit for supplying a rinsing liquid and a drying fluid may be further provided. The rinsing liquid is pure water, and the drying fluid is isopropyl alcohol (IPA).

Next, the nozzle 400 will be described in more detail.

Figure 3:
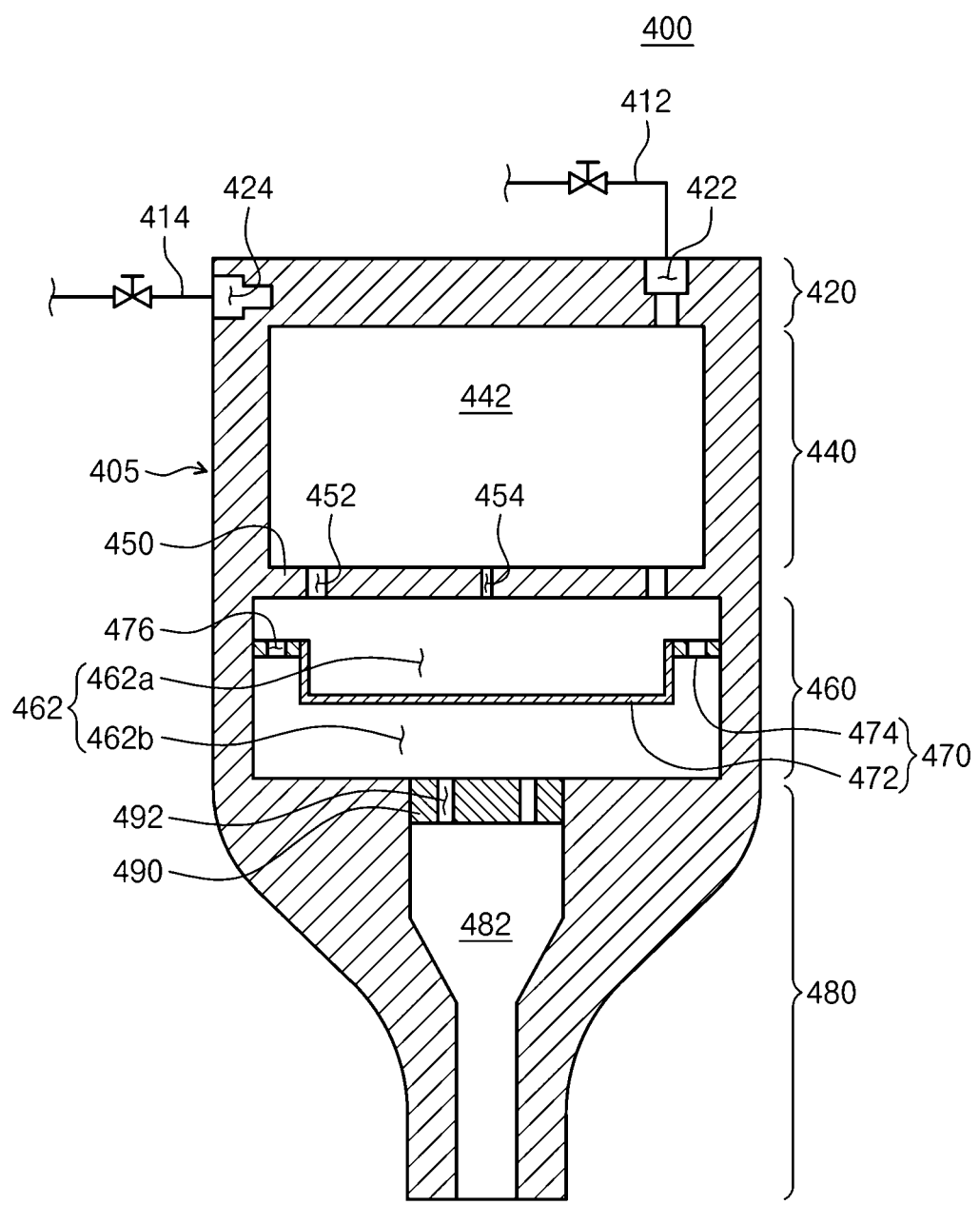
FIG. 3 is a sectional view illustrating a nozzle of FIG. 2.
Figure 4:
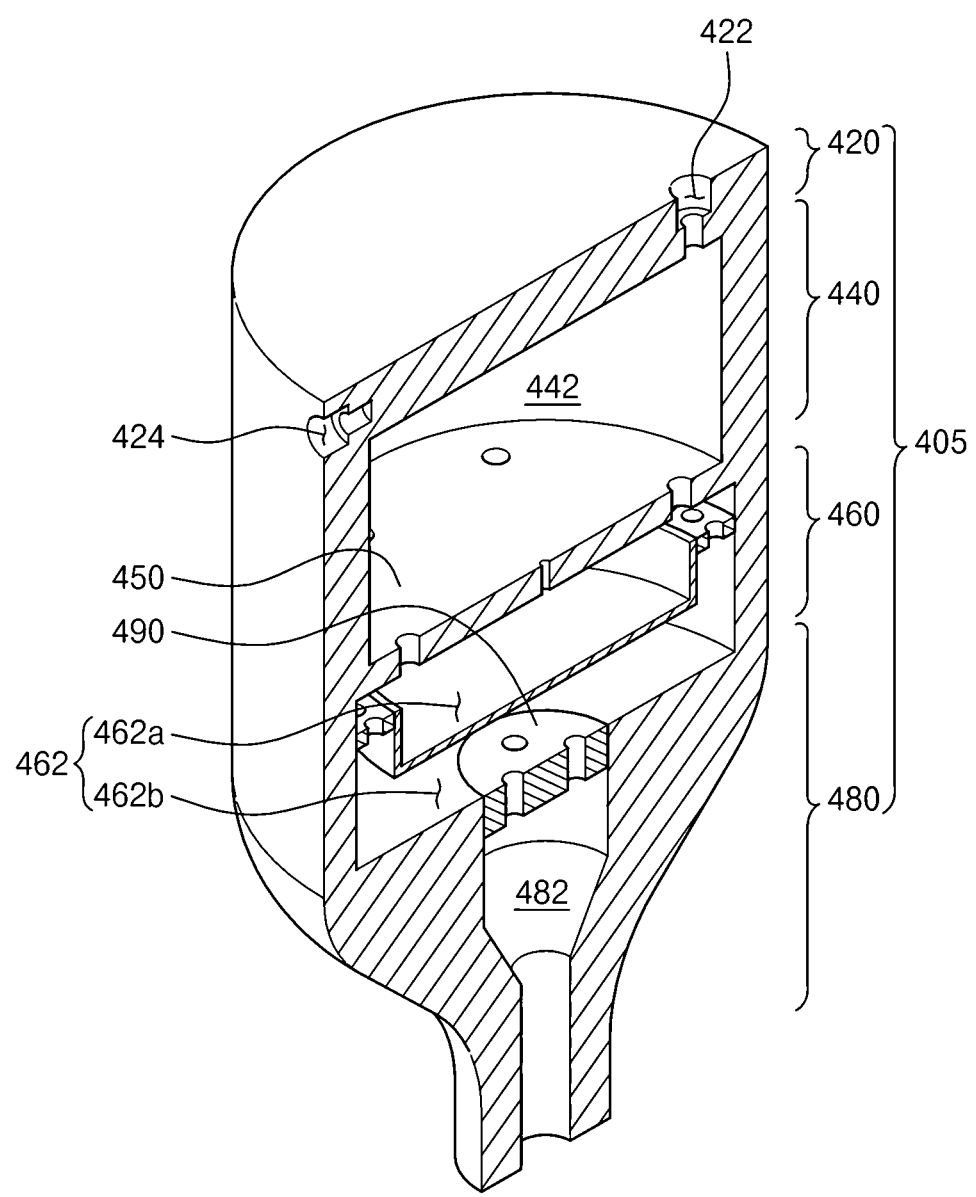
FIG. 4 is a cutaway perspective view taken along a vertical direction of the nozzle of FIG. 3.

FIG. 3 is a sectional view illustrating a nozzle 400 of FIG. 2. FIG. 4 is a cutaway perspective view taken along a vertical direction of the nozzle 400 of FIG. 3; Referring to FIGS. 3 and 4, the nozzle 400 includes a body 405, a separation plate 450, a collision member 470, and a lower plate 490. The nozzle 400 has an introduction part 420, a mixing part 440, a buffer part 460, and a discharge part 480. The introduction part 420, the mixing part 440, the buffer part 460, and the discharge part 480 are sequentially disposed along a direction from the upper side to the lower side. The introduction part 420, the mixing part 440, the buffer part 460, and the discharge part 480 are provided in spaces that are connected to each other.

A first liquid supply line 412 and a second liquid supply line 414 are connected to the introduction part 420. A first passage 422 and a second passage 424 are formed in the introduction part 420. The first passage 422 functions as a passage through which a first liquid flows, and the second passage 424 functions as a passage through which a second liquid flows. The first liquid supply line 412 is connected to the first passage 422, and the second liquid supply line 414 is connected to the second passage 424. The first liquid and the second liquid are supplied to the mixing part 440 through the introduction passages 422 and 424. According to an embodiment, the first passage 422 may face a downward direction, and the second passage 424 may face a spiral direction. The downward direction is parallel to an axial axis of the nozzle 400 and the spiral direction is along a radial direction of the nozzle 400 and perpendicular to the downward direction. The second passage 424 may extend from an outer surface to an inner surface of the nozzle 400. A lower end of the first passage 422 and a lower end of the second passage 424 may be located adjacent to an inner surface of the mixing part 440. Accordingly, while the first liquid may be supplied to a downward direction that is perpendicular to the mixing part 440, the second liquid may be supplied in a spiral direction from the mixing part 440. The first liquid and the second liquid may form vortices while flowing in spiral directions.

The mixing part 440 has a mixing space 442 in the interior thereof. The mixing space 442 functions as a space in which the first liquid and the second liquid are mixed. The mixing space 442 extends downwards from an end of the first passage 422 and an end of the second passage 424. An inner surface of the mixing part 440 has an annular ring shape.

The separation plate 450 is located between the mixing part 440 and the buffer part 460. The separation plate 450 separates the mixing part 440 and the buffer part 460 from each other. The separation plate 450 has a plate shape having a first hole 452 and a second hole 454. For example, the separation plate 450 may have a disk shape. The separation plate 450 has a diameter that is smaller than that of the mixing part 440. The first hole 452 and the second hole 454 may be holes extending from an upper end to a lower end of the separation plate 450. The first hole 452 is located at a peripheral area of the separation plate 450, and the second hole 454 is located in a central area of the separation plate 450. A plurality of first holes 452 are provided, and are arranged to surround a periphery of the second hole 454. For example, the first holes 452 may be combined with each other to be arranged in an annular ring shape. The first holes 452 may be arranged to be spaced apart from each other at the same interval. The first holes 452 have a diameter that is larger than that of the second hole 454. The first holes 452 function as passages through which the treatment liquid is supplied from the mixing part 440 to the buffer part 460. The flow velocity of treatment liquid may increase while passing through the first holes. The second holes 454 function as holes for forming flow currents at the central axis of the mixing space 442. The gas generated in the buffer space 462 may be discharged to the mixing space through the second hole 454.

A buffer space 462 extending downwards from the mixing space 442 is formed in the buffer part 460. The treatment liquid may temporarily stay in the buffer space 462.

Figure 5:
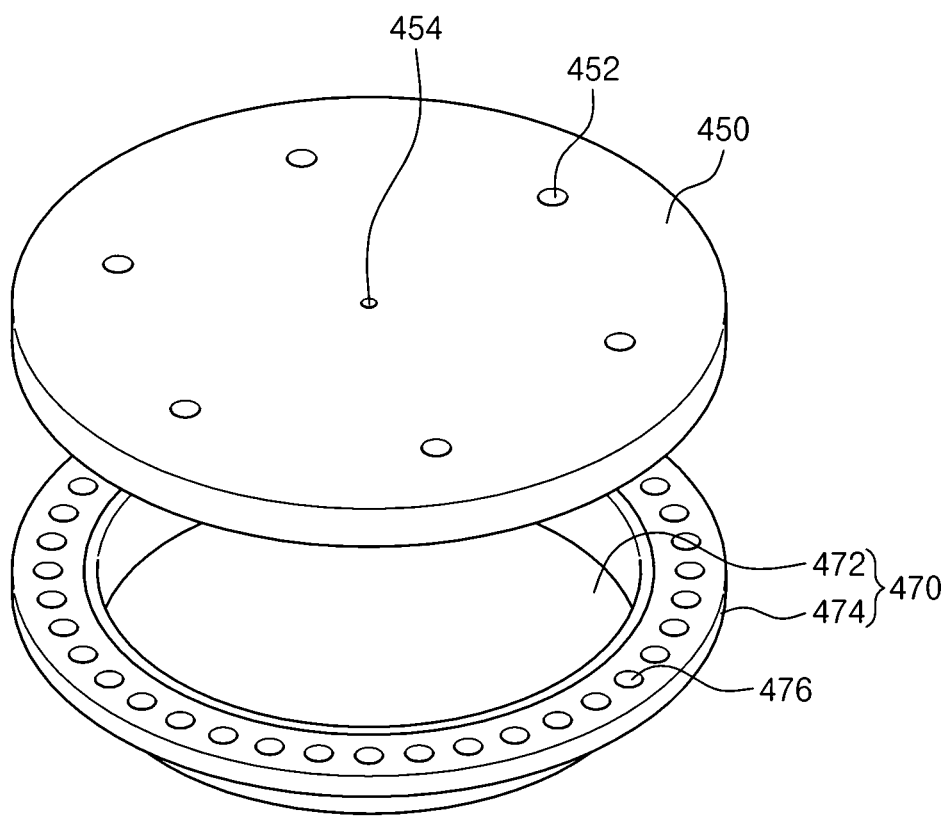
FIG. 5 is a perspective view illustrating a separation plate and a middle body of FIG. 3.

The collision member 470 is located in the buffer space 462. The collision member 470 allows the flow path of the treatment liquid to detour. The treatment liquid supplied to the buffer space 462 collides with the collision member 470. The collision member 470 includes a collision body 472 and a ring plate 474. FIG. 5 is a perspective view illustrating the separation plate and the collision member of FIG. 3. Referring to FIGS. 3 to 5, the buffer space 462 is divided into an upper space 462a and a lower space 462b by the collision member 472. The collision body 472 has an open-topped vessel shape. That is, the interior space of the collision body 472 may be provided in an area included in the upper space 462a. The collision body 472 is located to face the first holes 452. That is, the collision body 472 is located to block a supply path of the treatment liquid. Accordingly, the treatment liquid passing through the separation plate 450 is accommodated in the collision body 472. The treatment liquid accommodated in the collision body 472 overflows and is supplied to the lower space 462b. For example, the collision body 472 may be provided as a blocking plate having no hole.

The ring plate 474 has an annular ring shape that surrounds the collision body 472. The ring plate 474 is located at a height at which an upper end of the middle body 405 is located. A plurality of ring holes 476 are formed in the ring plate 474. The ring holes 476 are arranged along a circumferential direction of the ring plate 474. The treatment liquid overflowing from the collision body 472 is supplied to the lower space 462b through the ring holes 476. For example, the ring holes 476 may have a circular shape. Unlike this, the ring holes 476 may have a slit shape.

Selectively, the collision member 470 may include only a collision body 472. An upper end of the collision body 472 may be coupled to a bottom surface of the separation plate 450. In this case, the ring holes 476 may be formed on a side surface of the collision body 472.

The discharge part 480 has a discharge space 482 communicated with a discharge end, in the interior thereof. The discharge space 482 is a space having a width that is smaller than that of the lower space 462b. The lower space 462b and the discharge space 482 are divided by the lower plate 490. A plurality of lower holes 492 are formed in the lower plate 490. The treatment liquid is supplied from the lower space 462b to the discharge space 482 through the lower hole 492. When viewed from the top, the lower plate 490 overlaps the separation plate 450 and the collision body 472. According to an embodiment, the lower plate 490 may have a diameter that is smaller than those of the separation plate 450 and the collision body 472. The discharge space 482 may be provided such that the width of a lower area thereof is smaller than that of an upper area thereof. Accordingly, the bubbles contained in the treatment liquid may be removed from the discharge space 482 while being supplied.

Figure 6:
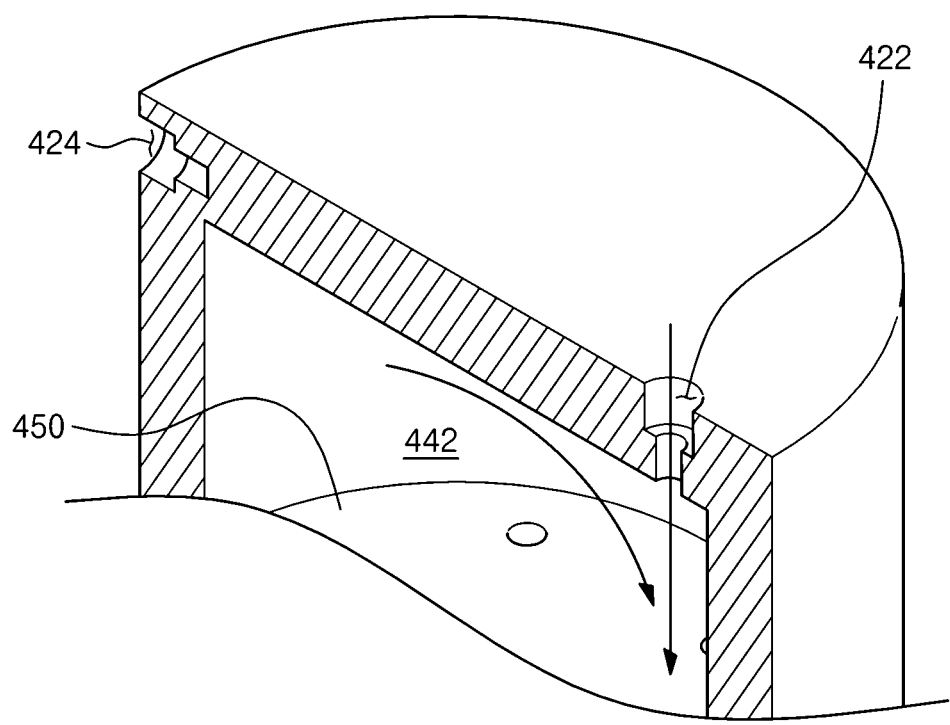
FIG. 6 is a view illustrating a direction in which a first liquid and a second liquid are introduced in a mixing space of FIG. 4.

According to the above-mentioned embodiments, the first liquid and the second liquid are mixed while moving in a spiral direction to form vortices in the mixing part 440. This is because the flow path of the second liquid may form flow currents, such as vortices, from the second hole 454 of the separation plate 450 while facing a spiral direction as illustrated in FIG. 6. Accordingly, the speed of mixing the first liquid and the second liquid may be improved.

Further, the separation plate 450 supplied the treatment liquid, the flow velocity of which has been increased, to the collision body 472. The bubbles burst while the treatment liquid collides with the collision body 472, and the bubbles generated in the treatment liquid may be primarily removed.

Further, the treatment liquid accommodated in the collision body 472 overflows and moves to the lower space 462b, and collides with the bottom surface that forms the lower space 462b. Then, the bubbles burst while the treatment liquid collides with the bottom surface that forms the lower space 462b, and the bubbles generated in the treatment liquid may be secondarily removed.

Further, even when the bubbles are not completely removed from the body 405 of the nozzle 400, the bubbles having relatively large sizes may be removed. Accordingly, the bubbles having relatively small sizes are supplied onto the substrate, and cannot spatter to the surrounding apparatus when though the bubbles burst.

The treatment liquid accommodated in the collision body 472 overflows and is moved to the lower space 462b. The treatment liquid temporarily stays in the collision body 472, and the flow velocity of the treatment liquid provided to the buffer part 460 is decreased as compared with the flow velocity of the treatment liquid provided to the mixing part 440. This provides a time period for which the bubbles may be removed before the treatment liquid is discharged.

Further, the treatment liquid is supplied from the lower space 462b to the discharge space 482 while passing through the lower plate 490. The lower plate 490 and the discharge space 482 have diameters that are smaller than that of the lower space 462b. Accordingly, the flow velocity of the treatment liquid is increased while the treatment liquid passes through the lower plate 490, and the flow rate of the discharged treatment liquid may be adjusted to a process flow rate.

According to an embodiment of the inventive concept, the treatment liquid in the nozzle, in which the bubbles are generated, collides with the collision member and temporarily stays. Accordingly, the bubbles burst while the treatment collides, and a time period for removing the bubbles may be secured while the treatment liquid temporarily stays.

Further, according to an embodiment of the inventive concept, the treatment liquid collides with the collision member while the flow velocity is increased when the treatment liquid passes through the separation plate. Accordingly, the bubbles included in the treatment liquid may be removed.

Further, according to an embodiment of the inventive concept, because the bubbles generated when the first liquid and the second liquid are mixed are removed in the nozzle, the treatment from which the bubbles are removed may be supplied onto the substrate, and thus the bubbles may be prevented from bursting on the substrate to contaminate the surrounding apparatus.

Further, according to an embodiment of the inventive concept, the separation plate has the second hole in a central area. The first liquid and the second liquid form vortices due to the flow currents passing through the second hole while being mixed, and the time period consumed to mix the first liquid and the second liquid may be reduced.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
   a substrate support unit configured to support a substrate; and
   a liquid supply unit configured to supply a treatment liquid in which a first liquid and a second liquid are mixed, onto the substrate supported by the substrate support unit,
   wherein the liquid supply unit includes:
      a nozzle configured to discharge the treatment liquid;
      a first liquid supply line configured to supply the first liquid to the nozzle; and
      a second liquid supply line configured to supply the second liquid to the nozzle, and
   wherein the nozzle includes:
      a body having a mixing space in which the first liquid and the second liquid are mixed and a buffer space extending from the mixing space, in the interior of the body; and a collision member located in the buffer space and configured to decrease a flow velocity of the treatment liquid supplied to the buffer space; and wherein the collision member includes:
 a collision body configured to divide the buffer space into an upper space and a lower space and having an open-topped vessel shape, wherein the upper space is between the mixing space and the lower space; and
 a ring plate surrounding the collision body and having an annular ring shape extending radially between a free edge of the collision body and the body, wherein a plurality of ring holes are formed in the ring plate and arranged along a circumferential direction of the ring plate.

2. The substrate treating apparatus of claim 1, wherein the nozzle further includes:
 a separation plate configured to separate the mixing space and the buffer space from each other and having a first hole.

3. The substrate treating apparatus of claim 2, wherein if viewed from upstream to the collision body, the collision body overlaps the first hole.

4. The substrate treating apparatus of claim 3, wherein the treatment liquid accommodated in the collision body overflows the collision body, and is supplied to the lower space through the ring holes.

5. The substrate treating apparatus of claim 4, wherein the body further has a discharge space extending from the lower space and including a discharge end,
 wherein the nozzle further includes:
 a lower plate configured to separate the lower space and the discharge space from each other and having a lower hole, and
 wherein if viewed from upstream to the collision body, the lower hole is located to overlap the collision body.

6. The substrate treating apparatus of claim 5, wherein the discharge space is provided such that a width of a lower area of the discharge space is smaller than a width of an upper area thereof.

7. The substrate treating apparatus of claim 2, wherein the first liquid includes sulfuric acid, and
 wherein the second liquid includes hydrogen peroxide.

8. The substrate treating apparatus of claim 2, wherein the first hole includes a plurality of first holes,
 wherein the separation plate further has a second hole,
 wherein the second hole is located in a central area of the separation plate,
 wherein the first holes are located to surround the second hole, and
 wherein if viewed from upstream to the collision body, the collision body overlaps the first and second holes.

9. The substrate treating apparatus of claim 8, wherein the diameters of the first holes are larger than the diameter of the second hole.

10. The substrate treating apparatus of claim 9, wherein the body further has a first passage extending to the mixing space and to which the first liquid supply line is connected, and a second passage extending to the mixing space and to which the second liquid supply line is connected,
 wherein the first passage faces a downward direction at a location that is adjacent to an inner surface of the mixing space,
 wherein the second passage is provided in a spiral direction at a location that is adjacent to the inner surface of the mixing space,
 wherein the downward direction is parallel to an axial axis of the nozzle, and
 wherein the spiral direction is along a radial direction of the nozzle and perpendicular to the downward direction.

11. A liquid supply unit for supplying a treatment liquid in which a first liquid and a second liquid are mixed, the liquid supply unit comprising:
 a nozzle configured to discharge the treatment liquid;
 a first liquid supply line configured to supply the first liquid to the nozzle; and
 a second liquid supply line configured to supply the second liquid to the nozzle, and
 wherein the nozzle includes:
 a body having a mixing space in which the first liquid and the second liquid are mixed and a buffer space extending from the mixing space, in the interior of the body; and
 a collision member located in the buffer space and configured to decrease a flow velocity of the treatment liquid supplied to the buffer space; and
 wherein the collision member includes:
 a collision body configured to divide the buffer space into an upper space and a lower space and having an open-topped vessel shape, wherein the upper space is between the mixing space and the lower space; and
 a ring plate surrounding the collision body and having an annular ring shape extending radially between a free edge of the collision body and the body, wherein a plurality of ring holes are formed in the ring plate and arranged along a circumferential direction of the ring plate.

12. The liquid supply unit of claim 11, wherein the nozzle further includes:
 a separation plate configured to separate the mixing space and the buffer space from each other and having a first hole, and
 wherein if viewed from upstream to the collision body, the collision body overlaps the first hole.

13. The liquid supply unit of claim 12, wherein the treatment liquid accommodated in the collision body overflows the collision body and is supplied to the lower space through the ring holes.

14. The liquid supply unit of claim 11, wherein the first liquid includes sulfuric acid, and
 wherein the second liquid includes hydrogen peroxide.

* * * * *